United States Patent [19]
Chen et al.

[11] Patent Number: 6,090,358
[45] Date of Patent: Jul. 18, 2000

[54] CRYSTALLINE $SI_xC_yN_z$ AND METHOD FOR SYNTHESIS

[75] Inventors: Li-Chyong Chen; Kuei-Hsien Chen, both of Taipei; Dhananjay Manohar Bhusari, Yung-Ho; Chun-Ku Chen, Taipei, all of Taiwan

[73] Assignee: National Science Council of Republic of China, Taipei, Taiwan

[21] Appl. No.: 08/915,173

[22] Filed: Aug. 20, 1997

[51] Int. Cl.[7] .................................................. C01B 33/00
[52] U.S. Cl. ..................... 423/324; 423/344; 427/249; 427/255; 427/255.2; 117/92; 117/101; 117/103; 117/108
[58] Field of Search ...................................... 423/324, 344; 427/255.2, 255, 249; 117/101, 92, 103, 108

[56] References Cited

U.S. PATENT DOCUMENTS

| | | | |
|---|---|---|---|
| 4,737,379 | 4/1988 | Hudgens et al. | 427/39 |
| 5,110,679 | 5/1992 | Haller et al. | 428/408 |
| 5,236,545 | 8/1993 | Pryor | 156/613 |
| 5,254,374 | 10/1993 | Devlin et al. | 427/553 |
| 5,320,878 | 6/1994 | Maya | 427/573 |
| 5,508,368 | 4/1996 | Knapp et al. | 427/534 |

*Primary Examiner*—Tom Dunn
*Assistant Examiner*—Cam N. Nguyen
*Attorney, Agent, or Firm*—Bacon & Thomas

[57] ABSTRACT

A novel material $Si_xC_yN_z$, having a crystal structure similar to that of $a.Si_3N_4$ with carbon atoms substituting most of the Si sites, is synthesized in crystalline form onto crystalline Si substrates by microwave plasma enhanced decomposition of carbon, silicon and nitrogen containing gasses.

7 Claims, 6 Drawing Sheets

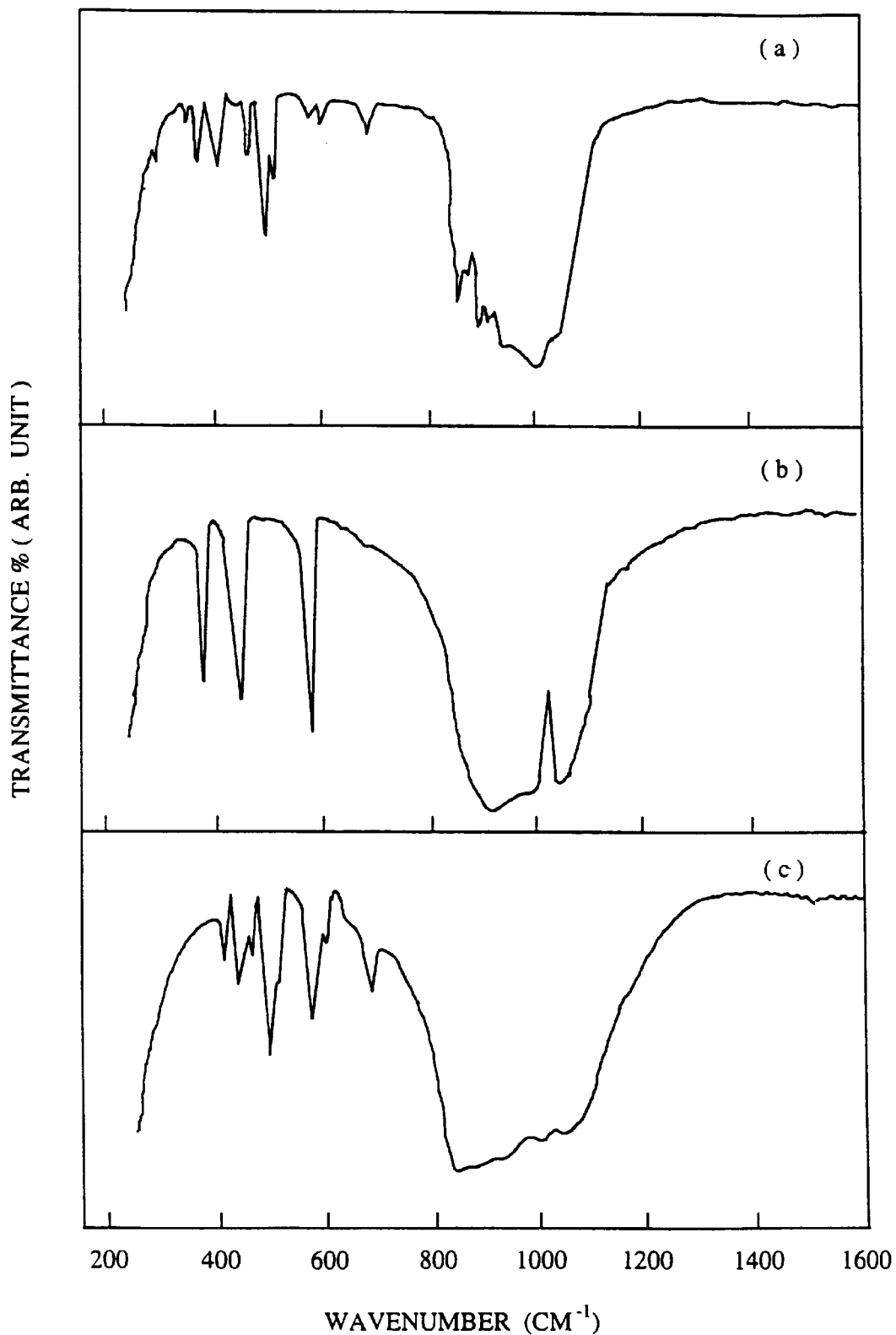
F I G. 3

CRYSTALLINE $Si_xC_yN_z$ AND METHOD FOR SYNTHESIS

BACKGROUND OF THE INVENTION

1. Field of the Invention

The present invention is relates to a synthesis method of a new material $Si_xC_yN_z$ in crystalline form on a crystalline substrates having appropriate lattice parameters and orientation for forming said material thereon.

2. Description of the Prior Art

Cohen M. L. [Phys. Rev. B, 32, 7988(1985)] has predicted high bulk modulus for covalently bonded carbon-nitrogen solid material. Particularly, $\beta$-$C_3N_4$, which is a carbon-nitride material with a crystal structure identical to that of $\beta$-$Si_3N_4$, was predicted to have exceptionally high bulk modulus and was thus predicated to be as hard as or even harder than diamond (Liu A. Y. and Cohen M. L., Science, 245, 941(1989)). Although this prediction greatly stimulated research for experimental realization of this material, to our knowledge, covalently bonded crystalline carbon-nitride solids with crystal sizes large enough to enable measurement of various physical and chemical properties have heretofore not been synthesized in any of the crystal phases, let alone the $\beta$ phase. Some researchers have only succeeded in synthesizing very tiny crystals (crystal size typically between 0.01 to $0.5\mu$)of carbon-nitride, embedded in the amorphous CN matrix, wherein volume of the crystalline phase accounts for less than 5% of the total volume of deposited material (Haller E. E., Cohen M. L. and Hansen W. L., U.S. Pat. No. 5,110,679(1992)).

Silicon nitride, in both of its crystalline phases $\alpha$ and $\beta$ in itself is of considerable interest for its applications as high performance engineering material because of its strength, high decomposition temperature and excellent resistance to corrosion and wear. Moreover, owing to its low mass density, it offers a light weight material for fabrication of components with excellent strength-to-weight ratio. For the same reasons, carbon-nitride, in any of its crystalline phases $\alpha$ or $\beta$, is even more desirable for such application.

However, since crystalline carbon-nitride has so far eluded the researchers while amorphous CN is readily realized (Okada T., Yamada S. and Wada T., Japanese Patent No.JP8-158039(1996), Okada T., Yamada S. and Wada T., Japanese Patent No.JP8-158040(1996), Fujikawa T. and Fujita N., Japanese Patent No., JP 3-240959(1991), Shimada T., Watanabe S. and Nakashi A., Japanese Patent No., JP 3-197364(1991), Suzuki S., Japanese Patent No. 61-174377 (1986)), the present inventors believed that incorporation of a small quantity of silicon during the growth of carbon-nitride would bring about improvement in the crystalline quality of the resulting material, since Si is known to readily form a well crystalline material with composition $Si_3N_4$, in either a or : phase. It was further believed that a substantial fraction of carbon would get incorporated in the crystalline form, thereby resulting in formation of new material with either of the known SiN crystal structures but with Si and C atoms interchangeably occupying the fourfold Si sites in the corresponding SiN structure. Such material is also expected to possess all the desirable properties of SiN or CN, such as high bulk modulus, high hardness, low mass density, high strength, wide optical band gap, high electrical resistance, high decomposition temperature, chemical innertness, resistance to wear and corrosion, high thermal conductivity etc.

SUMMARY OF THE INVENTION

It is therefore an objective of the present invention to provide a new crystalline $Si_xC_yN_z$ material, preferably comprising of a predominantly carbon-nitride network. It is further an objective of the present invention to provide a suitable method for synthesis of said material.

The present invention provides a novel crystalline material comprising a compound of tetrahedrally coordinated Si and C atoms covalently bonded with N atoms, with a structural short range order similar to that in $\alpha$-$Si_3N_4$, and a method for synthesis thereof Owing to the short covalent bonds between the Si, C and N atoms and a predominant CN network said material possesses various properties, such as those listed in the previous section, that are desirable for high performance engineering as well as advanced semiconductor device applications. While crystalline $Si_3N_4$ in $\alpha$ and $\beta$ phases as well as graphitic and polymeric $sp^2$-bonded carbon-nitride materials are well known, a covalent crystalline compound of $sp^3$-bonded Si and C atoms and $sp^2$-bonded N atoms has heretofore not been synthesized.

The present invention farther provides a method, comprising plasma enhanced decomposition of a mixture of silicon, carbon and nitrogen containing gasses such as methane, silane and nitrogen, in appropriate proportions, for deposition of said material onto crystalline Si substrates, heated to an appropriate temperature.

BRIEF DESCRIPTION OF THE DRAWINGS

The invention, as well as its many advantages, may be further understood by the following description and drawings in which:

Table 1 shows the comparison of Raman vibrational frequencies of $\alpha$-$Si_3N_4$* and $Si_xC_yN_z$.

Table 2 shows the comparison of Infrared absorption frequencies of $\alpha$-$Si_3N_4$* and $Si_xC_yN_z$.

Figure 1:
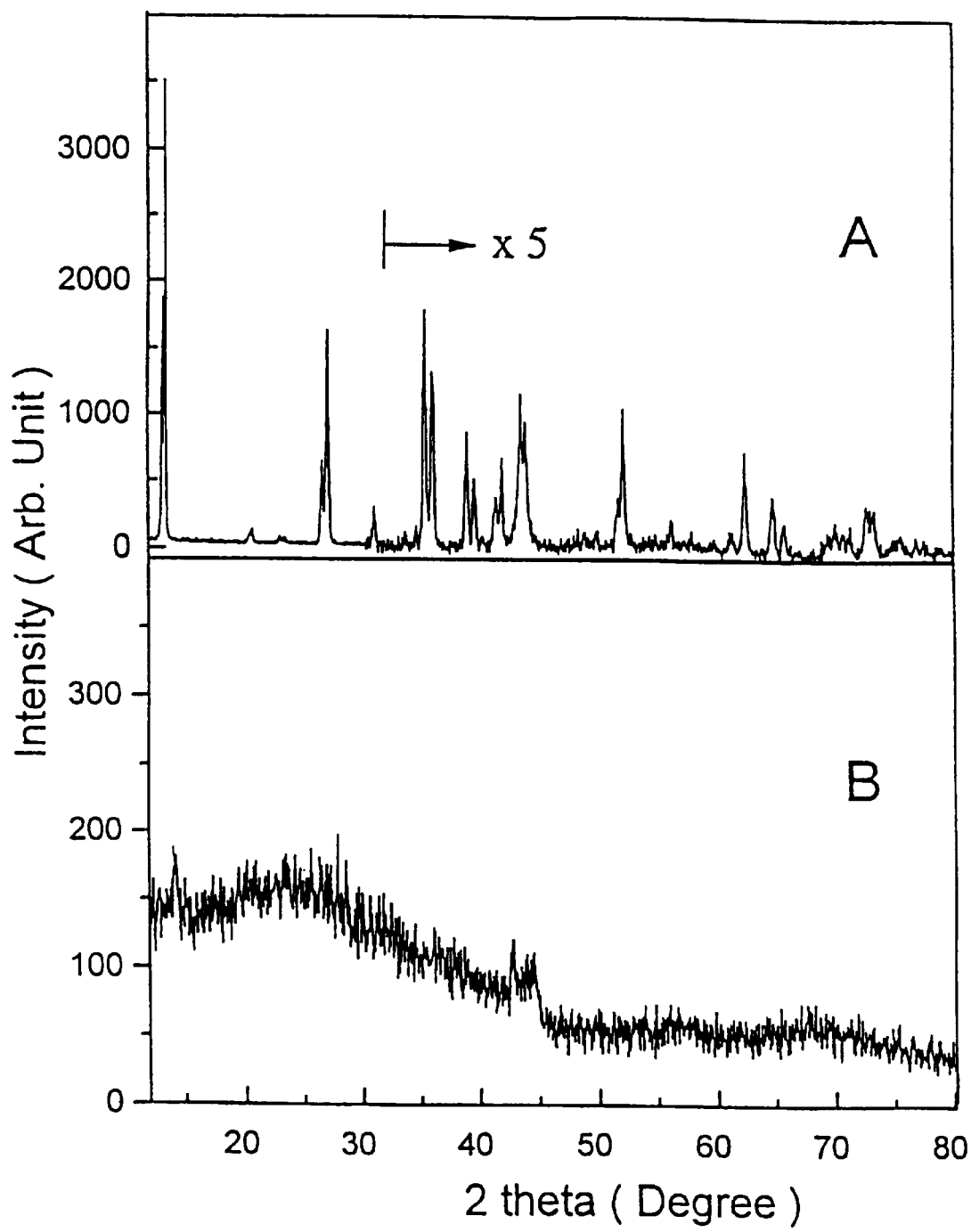

FIG. 1 X-ray diffraction spectrum of (A) polycrystalline $Si_xC_yN_z$ film and (B) amorphous $Si_xC_yN_z$ film.

Figure 2:
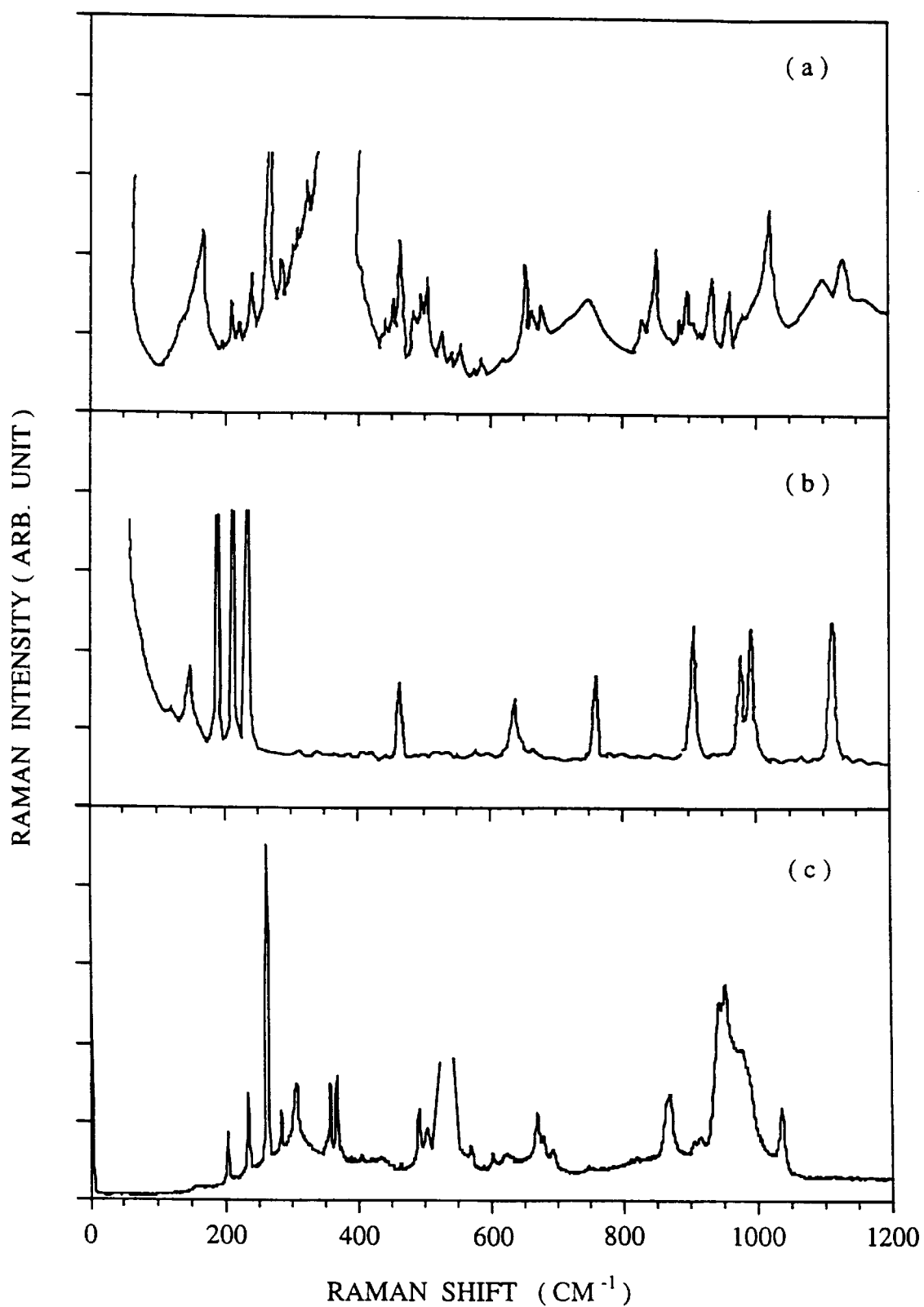

FIGS. 2(a),(b), and (c) shown, $\beta$-$Si_3N_4$, $\alpha$-$Si_3N_4$ and SiCN crystal of the present invention of Raman spectrum; and FIG. 3 are the ir absorption spectrum of (a) $\alpha$-$Si_3N_4$ (b) $\beta$-$Si_3N_4$ (c) SiCN.

Figure 4:
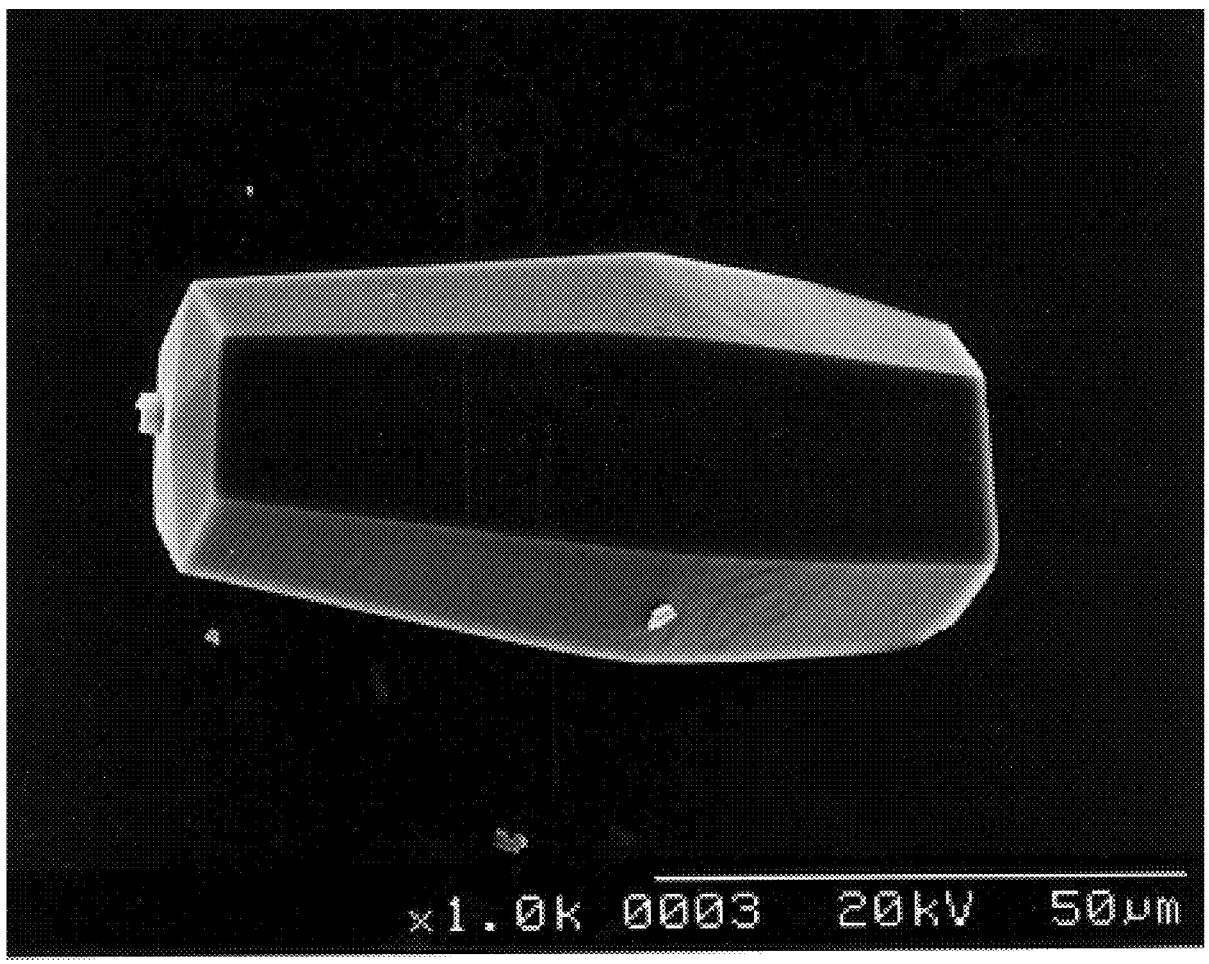
Figure 5:
Figure 6:
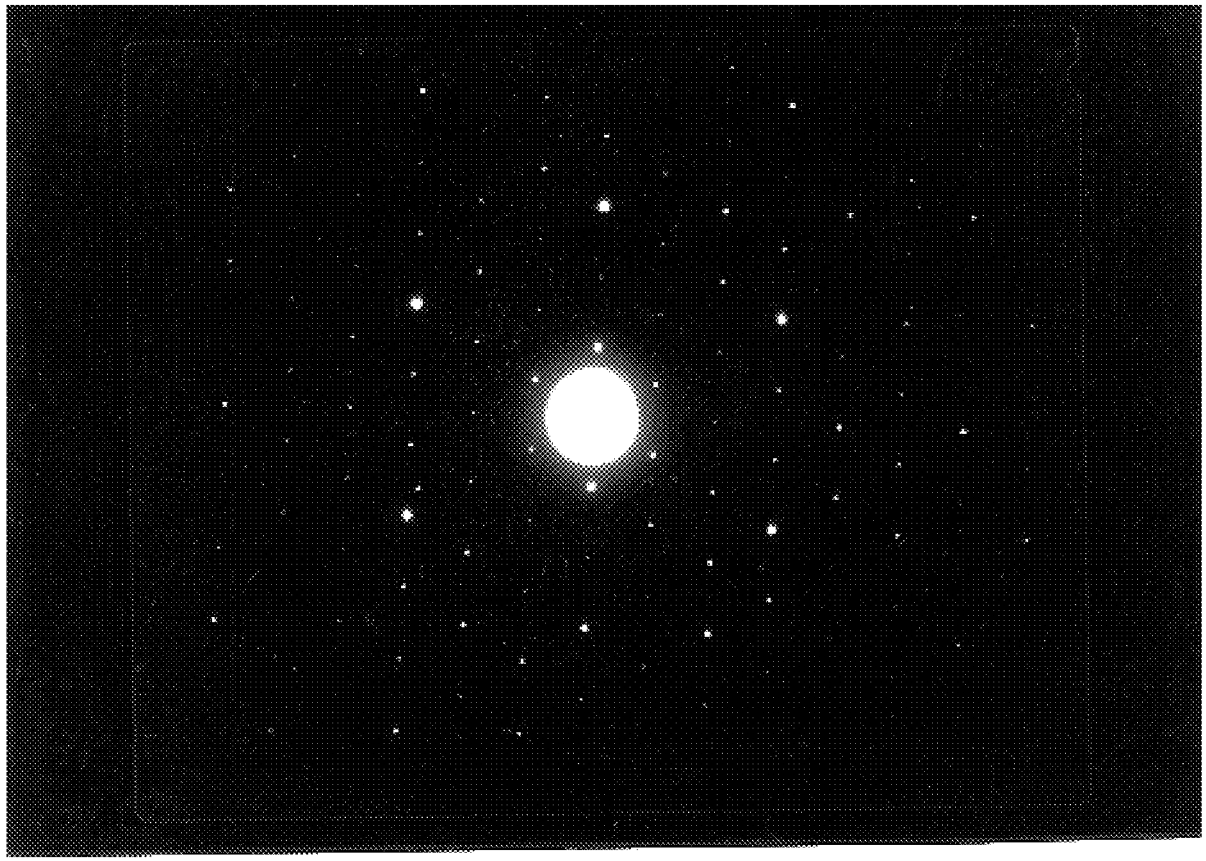

FIG. 4 shows the SME micrograph of a typical $Si_xC_yN_z$ crystal;

FIG. 5 shows the SME micrograph of a continuous polycrystalline $Si_xC_yN_z$ film;

FIG. 6 Transmission electron diffraction pattern of a typical $Si_xC_yN_z$ crystal;

DETAILED DESCRIPTION OF THE PREFERRED EMBODIMENT

A method for synthesis of polycrystalline thin films of said material onto crystalline Si substrates comprises energizing a mixture of carbon, silicon and nitrogen containing gasses, such as methane, silane and nitrogen, further diluted in hydrogen, at flow rates of 5–25, 0.4–0.8, 70–90 and 60–80 sccm respectively thereof, by means of coupling the same with a microwave resonant cavity, generating a microwave plasma thereby. The microwave power dissipated in the plasma should be at least sufficient to dissociate said gasses, typically between 1.0 to 3.5 KW. The total pressure in the deposition chamber may be 40 to 100 Torr. The aforementioned process also requires the Si substrates to be held at a temperature between 800 and 1200° C. for realizing the deposition of said material thereover. The aforementioned process also involves a process for cleaning the surface of Si substrates, comprising generation of a microwave plasma in pure hydrogen gas at a microwave power of 2 KW and a substrate temperature of about 800° C., prior to onset of the actual deposition process.

Notably, substrate temperature and fractions of silane and methane in the source gas ate the parameters that dedicate the form (amorphous or crystalline) of the resultant material. When the substrate temperatures is lower than 600° C., the deposited material is amorphous SiCN while for a substrate temperatures between 600–800° C. the film consists of very fine grain SiCN crystallites (few hundred nanometers in size), irrespective of the source gas composition. At substrate temperatures between 800–1000° C. and methane flow rates between 10–25 sccm, the deposited material is also amorphous SiCN for silane flow rates of less than 0.4 sccm, while it is crystalline SiCN at otherwise same deposition conditions but silane flow rates between 0.4–0.8 sccm. At substrate temperatures exceeding 1000° C., the material is again crystalline SiCN for silane flow rates between 0–0.8 sccm. For silane flow rates exceeding 0.8 sccm powder of amorphous silicon is principally formed irrespective of the substrate temperature. As for methane flow rates, crystalline SiCN is formed at flow rates between 5–25sccm, above 25 sccm amorphous carbon is formed, while below 5 sccm silicon nitride is predominantly formed. It has to be noted here, though, that the boundaries between these various zones corresponding to the various phases of the deposited material are not very well defined and there is often a considerable overlap. The present invention, however, pertains only to the crystalline material formed and hence all the ensuing discussion pertains only to the crystalline phase, unless mentioned otherwise.

The scanning electron micrograph of a typical crystal, several tens of microns in dimension, of said material resulting from the aforementioned process is presented in FIG. 4. These crystals are rod-like in shape with an aspect ratio of about 5–10, and have a hexagonal cross-section. The crystals also have a higher cross sectional area somewhere in the middle than at the ends. For longer deposition runs, clusters comprising of a few crystallites or formation of continuous polycrystalline film (as shown in FIG. 5) of few millimeters in size occurs. The parameters that dictate the size of individual crystals are substrate temperature, silane fraction of the source gas and obviously the duration of deposition. Lower substrate temperatures and low silane flow rates result in deposition of smaller crystals. At a typical source gas composition of 20 sccm $CH_4$, 0.5 sccm $SiH_4$, 80 sccm $N_2$ and 80 sccm $H_2$, microwave power of 3.0 KW, substrate temperature of 1000° C. and deposition time of 24 hours, the deposited crystals are typically 50–60 $\mu$m long and 10–15 $\mu$m in thickness.

The chemical composition of the polycrystalline films resulting from the aforementioned process were assessed from the Auger electron spectra recorded on the Scanning Auger Nanoprobe system (Perkin Elmer, model No. PHI 670), capable of acquiring data from area as small as 500 A. This particular capability of the machine enabled use of probe size smaller than the size of individual crystals, thereby enabling determination of chemical composition of individual crystals and not merely the gross chemical composition over large are, i.e. averaged over several crystals. The Auger spectrometer was operated at electron beam energy of 5 KV and depth profiling was achieved by using Ar ion beam of energy 3–4 KV. The atomic sensitivity factors used for calculating the actual fractions of Si, C, N and O in the crystals were 0.14, 0.23, 0.28 and 0.4 respectively. The Auger electron spectra of individual crystal of said material yielded the chemical composition of said crystals to be in the range as—Si—15–20 at. %, C—30–40 at. %, N—45–55 at. % and O—1–2 at. % and the corresponding depth profiles confirmed that this composition remains roughly constant (variation of about 2–5 at. %) throughout the depth analyzed. Moreover, a closer examination of the fine structure of carbon Auger line reveals that the carbon atoms in these crystals are sp coordinated. It may be mentioned here that the chemical composition of the deposited material is sensitive mainly to the substrate temperature and the source gas composition. A significantly greater incorporation of Si occurs at substrate temperatures exceeding 1000° C. and at higher silane fractions in the source gas. It may also be noted here that the chemical composition of every individual crystal on the same substrate also varies over a small range of about 5 to 7 at. %. The chemical composition of the amorphous SiCN phase, on the other hand, was found to be C—50–55 at. %, Si—20–30 at. % and N—20–30 at. %.

The chemical bonding between Si, C and N in the aforementioned crystals was investigated by x-ray photo-electron spectroscopy (XPS). The XPS spectra were recorded on a VG Microtech MT-500 ESCA system. The Mg K a radiation of energy 1253.6 eV, with a linewidth of 0.7 eV, was employed as source and the typical pass energy was 20 eV. Curve fitting software (ESCA Tools) provided by Surface Interface was used to analyze the XPS data. The experimental uncertainty in determination of binding energy was about ±0.4 eV. The wide scan XPS spectra also indicating presence of Si, C, N and a negligible amount of O in the material. The narrow scan spectra of the Si(2p), C(1s) and N(1s) peaks revealed that all these peaks comprised of more than one Gaussian peaks, indicating multiple bonding structures between the constituent atoms Si, C and N. The Si(2p) photo-electron peaks could be resolved into three peaks centered at 99.2–99.9, 101.6–102.7 and 103.5–104.6 eV respectively. These peaks respectively belong to Si(2p)—Si, Si(2p)—N and Si(2p)—O bonding. The Si—Si peak is believed to originate from the Si substrate surface uncovered by the crystals and not derived from the crystals. Notably, there is no separate peak that matches the Si(2p)—C binding energy of 100.3 eV, thus suggesting absence of Si—C bonds in the concerned crystals.

The C(1s) photo-electron peak comprises of two components centered at 284.8–285.7 and 287.2–288.4 eV respectively, whereas the N(1s) peak also consists of two components centered at 397.5–398.5 and 399.5–400.6 eV respectively. Although the assignment of these C(1s) and N(1s) photo-electron peaks to some specific bonding structures is not as straightforward as those of Si(2p) peaks, the shift of C(1s) binding energy to a higher value compared to that of the C—C bond in diamond or graphite (284.5 eV) confirms the bonding of carbon with more electronegative nitrogen. Also, consistent with the Si(2p) peaks, the C(1s) peak does not show any separate peak at 283 eV corresponding to the C(1s)—Si bonding. Thus the presence of Si—C bonds in the concerned crystals is believed to be negligible. A comparison of this data with that reported by Marton et al. (Phys. Rev. Lett., 73,118(1994) and Sjostrom et al. Phys. Rev. Lett., 75,1336(1995)) confirms that the carbon atoms in these crystals are tetrahedrally coordinated and covalently bonded with nitrogen. The absence of Si—C bonds further suggest that the carbon atoms substitute only at the fourfold Si sites and vise versa, Si and C atoms therefore being always bridged by the N atoms. These findings, in conjunction with the aforementioned chemical composition of these crystals synthesized in the present invention consist of a predominantly carbon-nitride network.

The x-ray diffraction (XRD) spectra of the polycrystalline SiCN film consisted of many sharp lines (FIG. 1(A)), characteristic of crystalline material, while the XRD spectra of amorphous SiCN phase displayed only broad humps (FIG. 1(B)), characteristic of an amorphous material. Notably, the XRD spectra of crystalline films do not display any broad peaks, suggesting the absence of amorphous phase in the crystalline films. The presence of large number of sharp diffraction lines in these spectra further suggests a crystal structure with low symmetry. The d values (i.e. interplanar spacings), as obtained from the XRD spectra, do not match completely with those of either $\alpha$ or $\beta$ phases of both $Si_3N_4$ as well as $C_3N_4$. This is obvious since the present ternary alloy would have different lattice spacings even if it retains the same short range and long range orders of either $\alpha$ or $\beta$ phases. One can, nevertheless, assume a certain stoichiometry and crystal structure or this material and calculate the corresponding lattice spacings and consequently index the observed diffraction peaks accordingly. But possibility of the presence of more than one phases in the polycrystalline film does not guarantee that the results thus obtained would be unambiguous. Notably, recent theoretical studies have shown that as much as four different phases of carbon-nitride can exist as stable compounds only for the $C_3N_4$ stoichiometry. Moreover, there is also no reason to believe that $C_3N_4$ would be the only stable stoichiometry. In fact, recent experimental results have shown that $C_2N$ is a more stable phase than $C_3N_4$ (Zhang et al., Appl. Phys. Lett., 68,2639(1996)). In addition to this difficulty, variations in chemical composition of individual crystals in the present polycrystalline films, as observed by Scanning Auger studies, further complicate the analysis of diffraction spectra. Thus, unambiguous identification of the structure of the present SiCN crystals has not been possible by x-ray diffraction studies. Transmission electron microscopy (TEM) was then employed to investigate the structure of this new crystalline material. Since this technique probes the structure of individual crystal, as opposed to XRD which is a bulk technique, these studies were expected to reveal whether multiple phases are present. These investigations were performed using Hitachi H-7100 microscope at an operating voltage of 75 KV. The specimen were prepared by scrapping and grinding the film, suspending the resulting fragments in methyl alcohol and finally depositing the suspension onto Cu grid. These investigations revealed the presence of two different microstructures, one giving single crystal diffraction pattern while the other giving powder diffraction pattern. The volume fraction of the specimen that gives powder diffraction pattern was less than 10%. Since the samples for these studies were prepared by scrapping and grinding the film, the information pertaining to relative position of these specimen in the film was lost. We however believe that the fine grained polycrystaline material lies only at the interface since the SEM micrographs are overwhelmed by large grain crystals. The typical transmission electron deffraction pattern obtained from one of the large grain crystals is presented in Attach 3. As should be expected, the lattice spacing obtained from this deffraction pattern do not match completely with those of either $\alpha$ or $\beta$ phases of both $Si_3N_4$ or $C_3N_4$. However, since the electron diffraction patterns for these crystals suggest a hexagonal structure, the lattice parameters a and c(as conventionally defined for hexagonal structures) can be calculated. Such hexagonal structure is consistent with the morphology observed from the SEM micrographs. The preliminary estimates of the magnitudes of lattice parameters a and c are 5.4 and 6.7 a respectively. Consistent with the observed variations in the chemical composition of individual crystals, a variation of ±10% in the values of these parameters are observed from crystal to crystal. The fact that lattice parameter c is much larger than a suggests that these crystals possess a hexagonal structure with large number of atoms per unit cell. It may be noted here that $\alpha$ phase of the $Si_3N_4$ contains larger number of atoms per unit cell than the $\beta$ phase. The volume of unit cell of $Si_xC_yN_z$ crystals, as estimated from the above diffraction data, is between the cell volumes of $\alpha$-$Si_3N_4$ and $\alpha$-$C_3N_4$. Moreover, the magnitude of the a and c parameters would be much different for the $\beta$ phase. The TEM results thus suggest that the present SiCN crystal may have structure close to that of $\alpha$-$Si_3N_4$.

Further support to this conclusion can be sought from the following Raman scattering and infrared (ir) absorption studies. The Raman and ir absorption spectra of both the $Si_3N_4$ phase are well known. Although the Raman and ir absorption frequencies for either of the $C_3N_4$ phases have not been theoretically calculated so far, one can nevertheless obtain these been theoretically calculated so far, one can nevertheless obtain these frequencies by properly scaling the corresponding $Si_3N_4$ spectra, assuming the crystal structure to be identical. The scaling factor can be estimated from the ratios of bulk modulus and bond lengths between $Si_3N_4$ and $C_3N_4$ by using the Hook's law approximation as—

$$\frac{W_{CN}}{W_{SiN}} = \left(\frac{B_{CN} d_{CN} \mu_{SiN}}{B_{SiN} d_{SiN} \mu_{CN}}\right)^{1/2}$$

where $\omega$ is the vibrational frequency, B is the bulk modulus, d is the bond length and $\mu$ is the reduced mass of the respective materials.

It is clear that the magnitude of scaling factor depends on C—N bond length and bulk modulus of $C_3N_4$, for which only theoretical estimations are available. Although there is a unanimity between various theoretical studies regarding the C—N bond length, the theoretical estimates of bulk modulus vary widely. For instance, Liu and Cohen (Phys. Rev. B, 42,10727(1990)) estimated the bulk modulus of $C_3N_4$ to be comparable to that of diamond, Guo and Goddard III [Chem. Phys. Lett., 237,72(1995)] suggested a value merely half of it. As a result, the scaling factor is 1.44 and 0.91 from the respective results. This large discrepancy in the magnitude of bulk modulus between said two studies has resulted only from the different assumptions considered in these studies. Clearly, the real bulk modulus could be anywhere between these two magnitudes.

The Raman spectra of $\beta$-$Si_3N_4$, $\alpha$-$Si_3N_4$ and the present SiCN crystals are presented in FIGS. 2(a), (b) and (c) respectively, whereas the ir absorption spectra of the respective materials are presented in FIGS. 3(a), (b) and (c). It can be noted that both Raman as well as ir spectra of the present SiCN material are similar to those of $\alpha$-$Si_3N_4$ and are much different from those of $\beta$-$Si_3N_4$. Notably, most of the Raman as well as ir vibrational frequencies of SiCN match quite nicely with those of $\alpha$-$Si_3N_4$ (see Table 1 and 2), although their relative intensities differ. Such similarity in the Raman and ir vibrational frequencies between $\alpha$-$Si_3N_4$ and SiCN can result only from the exact similarity in the structural short range order between these two materials. The relative intensities, on the other hand, would vary due to the modification of coupling constants of various vibrational modes, brought about by the presence of a significant of carbon in the SiCN crystals compared to $\alpha$-$Si_3N_4$. These spectra thus provide additional evidence for the structural short range order in the present SiCN crystals to be similar to that in $\alpha$-$Si_3N_4$. The matching between Raman and ir vibrational frequencies of these two materials further suggests that the actual scaling factor between $\alpha$-$Si_3N_4$ and SiCN, based on bond lengths, bulk modulus and reduced mass, is close to unity.

It is thus concluded that the present invention provides a novel crystalline material $Si_xC_yN_z$ with a probable stoichiometry of $(Si_3C)_3N_4$ and possesses a structure similar to that of $\alpha$-$Si_3N_4$. The present invention also provides a method for synthesis of the aforementioned material.

Many changes and modifications in the above described embodiment of the invention can, of course, be carried out without departing from the scope thereof. Accordingly, to promote the progress in science and the useful arts, the invention is disclosed and is disclosed and is intended to be limited only by the scope of the appended claims.

TABLE 1

Comparison of Raman vibrational frequencies of $\alpha$-$Si_3N_4$* and $Si_xC_yN_z$.

| $\alpha$-$Si_3N_4$ ($cm^{-1}$) | $Si_xC_yN_z$ ($cm^{-1}$) | $\alpha$-$Si_3N_4$ ($cm^{-1}$) | $Si_xC_yN_z$ ($cm^{-1}$) |
|---|---|---|---|
| 153 | — | 537 | overlap with Si |
| 202 | 199 | 569 | 566 |
| 231 | 230 | 601 | 598 |
| 258 | 259 | — | 619 |
| 282 | 280 | 667 | 664 |
| 298 | 303 | — | 674 |
| 306 | — | 691 | 688 |
| 321 | — | — | 742 |
| 337 | — | 763 | — |
| 356 | 354 | 848 | — |
| 361 | 364 | 868 | 863 |

TABLE 1-continued

Comparison of Raman vibrational frequencies of $\alpha$-$Si_3N_4$* and $Si_xC_yN_z$.

| $\alpha$-$Si_3N_4$ ($cm^{-1}$) | $Si_xC_yN_z$ ($cm^{-1}$) | $\alpha$-$Si_3N_4$ ($cm^{-1}$) | $Si_xC_yN_z$ ($cm^{-1}$) |
|---|---|---|---|
| 383 | — | 914 | 912 |
| 391 | 400 | 951 | 948 |
| 460 | 459 | 975 | 973 |
| 470 | 487 | 1032 | 1030 |
| 514 | overlap with Si | 1107 | — |
|  |  | 1142 | — |

*Taken from Wada N., Solin S. A., Wong I. and Prochazka S., J. Non-Cryst. Solids, 43, 7 (1981).

TABLE 2

Comparison of Infrared absorption frequencies of $\alpha$-$Si_3N_4$* and $Si_xC_yN_z$.

| $\alpha$-$Si_3N_4$ ($cm^{-1}$) | $Si_xC_yN_z$ ($cm^{-1}$) | $\alpha$-$Si_3N_4$ ($cm^{-1}$) | $Si_xC_yN_z$ ($cm^{-1}$) |
|---|---|---|---|
| 412 | 408 | 688 | 683 |
| 440 | 434 | 855 | 840 |
| 463 | 459 | 874 | 880 |
| 499 | 491 | 895 | — |
| 512 | 507 | 909 | — |
| 580 | 573 | 935 | 948 |
| 600 | 598 | 995 | 998 |
| — | 631 | 1040 | 1036 |

*Taken from Wada N., Solin S. A., Wong I. and Prochazka S., J. Non-Cryst. Solids, 43, 7 (1981).

What is claimed is:

1. A method of synthesizing a ternary $Si_xC_yN_z$ compound comprising a predominantly carbon-nitride network in crystalline form on a crystalline Si substrate, wherein the chemical composition of the ternary compound is in the range of Si: (x=) 15–20 at. %, C: (y=) 30–40 at. % and N: (z=) 45–55 at. %, which comprises perform ing plasma enhanced deposition of a mixture of methane, silane, nitrogen and hydrogen containing gases, at flow rates of 5–25, 0.4–0.8. 70–90 and 60–80 sccm, respectively, for said gases, wherein the substrate is held at a temperature of between 800 and 1200° C. to produce said ternary crystalline compound.

2. The method as claimed in claim 1, wherein the total pressure is 40 to 100 Torr.

3. The method as claimed in claim 1, wherein the carbon atoms are $sp^3$-coordinated.

4. The method as claimed in claims 1, wherein said crystalline Si substrate has <100> orientation.

5. The method as claimed in claim 1, wherein said crystalline Si substrate has <111> orientation.

6. The method as claimed in claim 1, wherein said energy source for generation of plasma is microwave radiation.

7. The method as claimed in claim 1, wherein the microwave power dissipated in the plasma is 1.0 to 3.5 KW.

* * * * *